(12) United States Patent
Farkas et al.

(10) Patent No.: US 7,269,753 B2
(45) Date of Patent: Sep. 11, 2007

(54) MAPPING POWER SYSTEM COMPONENTS

(75) Inventors: Keith Istvan Farkas, San Carlos, CA (US); Parthasarathy Ranganathan, Palo Alto, CA (US); Lawrence Sivert Brakmo, Discovery Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 434 days.

(21) Appl. No.: 10/927,235

(22) Filed: Aug. 27, 2004

(65) Prior Publication Data

US 2006/0044117 A1    Mar. 2, 2006

(51) Int. Cl.
*G06F 11/30* (2006.01)

(52) U.S. Cl. ................................ 713/340; 713/330

(58) Field of Classification Search ................ 713/340, 713/330
See application file for complete search history.

(56) References Cited

U.S. PATENT DOCUMENTS 5,455,464 A    10/1995    Gosling
5,675,813 A  * 10/1997    Holmdahl .................... 713/310
5,752,046 A  *  5/1998    Oprescu et al. ............. 713/300
6,111,735 A  *  8/2000    Nelson et al. ................ 361/64

FOREIGN PATENT DOCUMENTS

EP              395495         4/1990
WO         WO2004/040731       5/2004

* cited by examiner

Primary Examiner—Thuan N. Du

(57) ABSTRACT

Power system components are mapped using a controller and a data collection system. The controller is operable to transmit a first power system component ID for the first power system component to a second power system component, wherein the second power system component receives power from the first power system component. The data collection system is operable to receive from the second power system component the first power system component ID and a second power system component ID for the second power system component. The data collection system is further operable to associate the first power system component with the second power system component based on the received IDs.

65 Claims, 9 Drawing Sheets

MAPPING POWER SYSTEM COMPONENTS

TECHNICAL FIELD

The technical field relates generally to power systems. More particularly, the technical field relates to managing the load on components in a power system.

BACKGROUND

A typical power system for a data center includes several, possibly hundreds, of circuit breakers connecting data center power sources to computer systems. In certain situations, such as at installation or for performing maintenance on a computer system, it is important to know the computer system-to-breaker mapping and the rated current, actual current, and/or volt-ampere draw of the computer systems to prevent a circuit breaker from being overloaded. For example, the computer system-to-breaker mapping is needed to allow a system administrator to turn off power to a given rack housing the computer system when service of the rack power supply is required or when the rack is being relocated.

The mapping and the rated current, actual current, and volt-ampere draw are also needed for capacity planning, such as to prevent overloading a circuit or power distribution unit (PDU) when connecting computer systems to the circuit or PDU. Capacity planning encompasses two issues. First, when a computer system needs to be connected to a circuit supplying power to the computer system, such as when the computer system is installed or relocated, the system administrator must ensure that there is sufficient capacity available in a circuit to meet the power needs of the computer system. Second, for reliability, an uninterruptible power supply (UPS) unit connected to the circuit and computer system must be sized so that the UPS can supply the load demanded by the computer systems connected thereto when the main power supply to the data center fails. Thus, before a computer system is connected to the data center's electrical grid, it is important for the system administrator to determine whether there is sufficient unallocated power capacity (UPC) available.

In today's data centers, computer system-to-breaker mapping is determined and maintained manually. Typically, each circuit is labeled as it is installed with the PDU number and associated breaker number. When a computer system is subsequently installed, the system administrator records the label information along with the computer system information, for example, in a database. In a data center with hundreds if not thousands of computer systems, this procedure is costly and highly susceptible to error. Furthermore, this process has to be repeated with every change to the data center configuration, such as when new computer systems are added or old computer systems are replaced.

In addition, in today's data centers the current being drawn from a circuit is measured in various ways. However, there is no automated process for correlating a measured load with the computer systems drawing the current. In addition, there is no automated process for aggregating the rated load of the computer systems connected to each circuit. Rated load is important because the actual load of the computer systems is not necessarily representative of the maximum load the computer systems may draw. Hence, the measured load may not be sufficient.

SUMMARY

According to an embodiment, power system components are mapped using a controller and a data collection system. The controller is operable to transmit a first power system component ID for the first power system component to a second power system component, wherein the second power system component receives power from the first power system component. The data collection system is operable to receive from the second power system component the first power system component ID and a second power system component ID for the second power system component. The data collection system is further operable to associate the first power system component with the second power system component based on the received IDs.

BRIEF DESCRIPTION OF THE DRAWINGS

The present invention is illustrated by way of example and not limitation in the accompanying figures in which like numeral references refer to like elements, and wherein.

DETAILED DESCRIPTION OF EMBODIMENTS

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

Many of the embodiments described herein describe the automatic mapping of power system components. The embodiments are described with respect to a power system for a data center by way of example and not limitation. It will be apparent to one of ordinary skill in the art that the methods and apparatuses described herein are applicable to a power system used in any type of environment.

Figure 1:
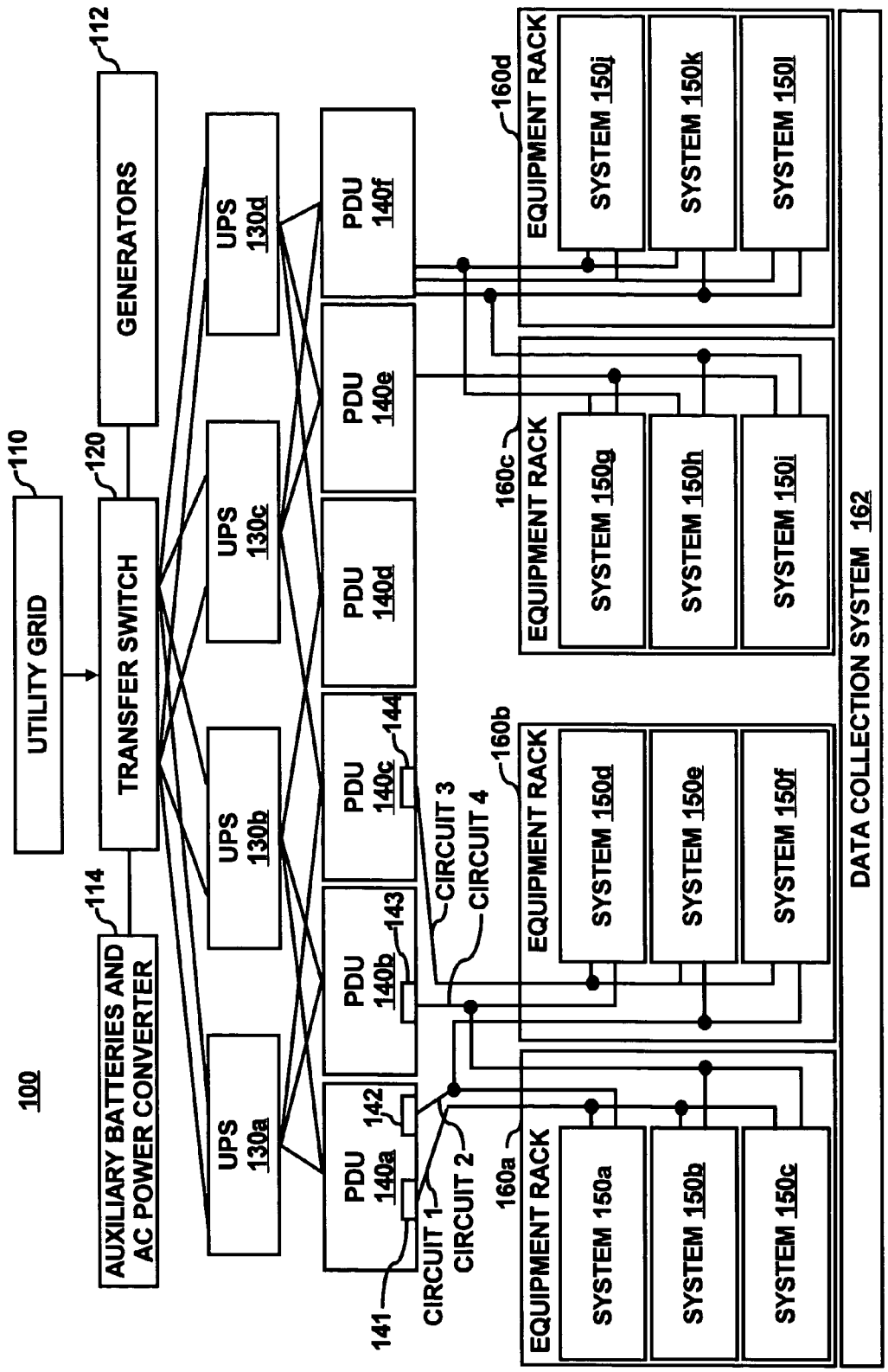
FIG. 1 illustrates a block diagram of a power system, according to an embodiment of the invention.

FIG. 1 illustrates a power system 100 for a data center, according to an embodiment. The power system 100, for example, may be used in a data center to supply power to a load, such as the computer systems 150a-l. The power system 100 is connected to a power utility grid 110 via a transfer switch 120. The power system 100 may also be connected to alternative energy sources, such as generators 112 and batteries 114. The transfer switch 120 controls which energy source is used to supply power to the power system 100. For example, the power utility grid 110 may be used as primary power source for the power system 100. If the power utility grid 110 fails or sufficient power is not being provided by the power utility grid 110, the transfer switch 120 supplies power to the power system 100 from the alternative energy sources. Alternatively, the alternative energy sources may be used as the primary power source for the power system 100, for example, because power may be supplied from the alternative energy sources at a cheaper rate. Then, power may be drawn from the power utility grid 110 as needed, for example, if the alternative energy sources cannot meet the demand of the system 100.

Other components of the power system 100 include UPSs 130a-d and PDUs 140a-f. The UPSs 130a-d are uninterruptible power sources that receive power from an energy source, such as the power utility grid 110, the generators 112 and/or the batteries 114. The UPSs 130a-d may provide uninterrupted power for at least a predetermined period of time to the load. For example, the UPSs 130a-d may supply uninterrupted power to the loads when the generators 112 are brought on line. Also, the UPSs 130a-d include circuits for minimizing undesired features of the power source, such as sags, surges, bad harmonics, etc.

The UPSs 130a-d are connected to the PDUs 140a-f. The PDUs 140a-f are power distribution units that supply power to the power supplies of the computer systems 150a-l, which may be housed in racks, such as the racks 160a-d. The PDUs 140a-f may include AC/AC power supplies, circuit breakers, power failure alarms, and other power conditioning circuits to step down the voltage and condition power supplied to the computer systems 150a-l. The computer systems 150a-l may include power supplies, not shown, that receive power from the PDUs 140a-f. The power supplies may be internal to the computer systems 150a-l or housed in the racks 160a-d.

Redundancy may be provided at one or more levels of the power system 100, also referred to as a grid. The power system 100 provides N+1 redundancy, where N=1 at one or more levels. However, the power system 100 may also be provided with greater redundancy, e.g., 3+1, 2N+1, etc. Each level may have N+1 redundancy. For 1+1 redundancy at the UPS level, each UPS 130a-d is connected to the transfer switch 120 using two separate electrical circuits (not shown) in the transfer switch 120 and two wires. Thus, the failure of any one circuit will not necessarily cause any of the computer systems 150a-l to loose power. Similarly, at the PDU level, each of the PDUs 140a-f is connected to at least two of the UPSs 130a-d. Thus, if for example the UPS 130a fails, the UPS 130b supplies power to the PDU 140a. Redundancy may also be provided at the PDU level. For example, the computer system 150a may draw current via circuit 1 and circuit 2, where the circuits 1 and 2 are connected to two different power distribution circuits in the PDU 140a so there is no single point of failure. Also, the computer system 150d receives current via circuits 3 and 4 connected to PDU 140c and PDU 140b respectively.

Circuits 1-4 may include the circuit breakers 141-144 (referred to as breakers 141-144) and other components, such as branch breakers in racks 160a-160d. At the computer system level, two power supplies may be used for each computer system to provide redundancy.

According to an embodiment, a system is provided for mapping endpoints of logical links in the power system 100 shown in FIG. 1. A logical link may include one or more wires and power system components. An example of a logical link shown in FIG. 1 is the connection between the breaker 141 and the computer system 150a. The endpoints of this logical link are the breaker 141 and the computer system 150a. Other examples of endpoints for logical links are as follows: the UPS 130a and the PDU 140a; the transfer switch 120 and the UPS 130a; etc.

Many times a system administrator may identify one endpoint of a logical link in the power system 100 and needs to know what is connected to other end of the logical link, i.e., the second endpoint of the logical link. FIG. 1 shows a data collection system 162 that automatically maps the endpoints of a logical link, which allows a system administrator to quickly identify the endpoints of a logical link. The data collection system 162 maps endpoints in the power system 100, which is described in further detail with respect to FIGS. 2-7. Mapping endpoints includes associating power system components that are endpoints to logical links in the power system 100. Power system components include, for example, any of the components shown in FIG. 1, including the computer systems 150. Mapping endpoints is described by way of example with respect to the connections between the breakers 141-144 and the computer systems 150a-f. However, any of the endpoints in the power system 100 may be mapped using the methods and apparatus described herein.

Figure 2:
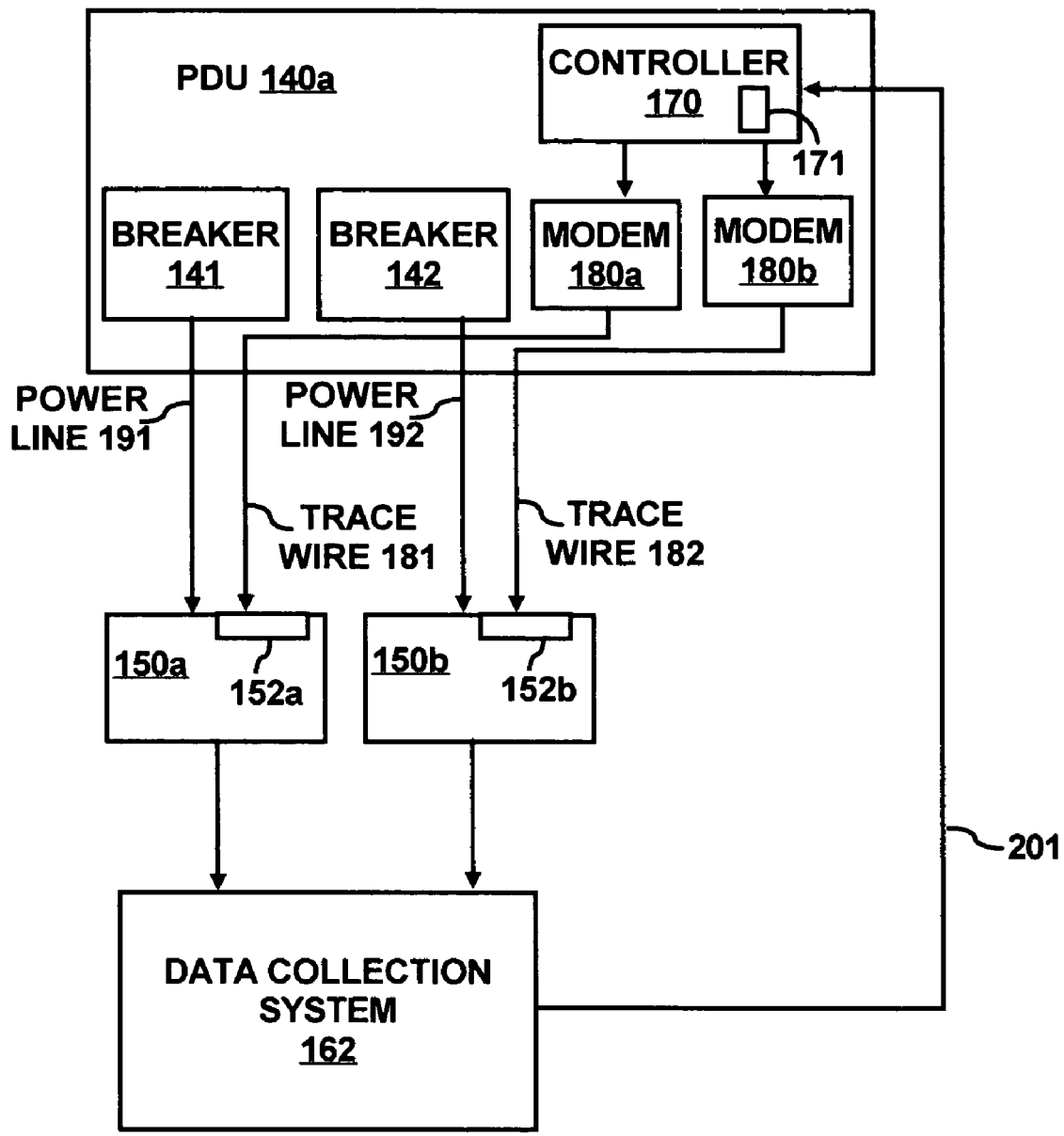
FIG. 2 illustrates a block diagram of a system for mapping endpoints in a power system using a trace wire, according to embodiment.

FIG. 2 illustrates a first embodiment of mapping computer systems to breakers. In FIG. 2, the PDU 140a includes breakers 141 and 142. The PDU 140a may include more or less breakers depending on the number of computer systems connected to the PDU 140a. Also, only the computer systems 150a and 150b are shown for purposes of illustrating this embodiment and the other embodiments described below. Also, although FIG. 1 illustrates that the computer system 150a receives power from the breakers 141 and 142, only one power connection to the computer system 150a from the breaker 141 is shown for purposes of describing the embodiment.

The PDU 140a includes a controller 170 storing the PDU ID and the breaker IDs for the PDU 140a and the breakers 141 and 142. The IDs may be stored in the nonvolatile memory 171.

The controller 170 is connected to the modems 180a-b for transmitting the IDs for the PDU 140a and the breakers 141 and 142 to the computer systems 150a-b and eventually for transmitting the IDs along with IDs for the computer systems 150a-b to the data collection system 162. The computer system 150c and its connections shown in FIG. 1 are not shown in FIG. 2 for purposes of discussing this embodiment. Also, although not shown in FIG. 2, the breaker 141 is connected to the computer system 150b as shown in FIG. 1.

The computer system 150a receives power from the breaker 141 via power line 191 and the computer system 150b receives power from the breaker 142 via power line 192. Thus, the breaker 141 and the computer system 150a are endpoints of a first logical link and the breaker 142 and the computer system 150*b* are endpoints of a second logical link. The respective endpoints are mapped by the data collection system 162.

In order to map the endpoints, the controller 170 shown in FIG. 2 transmits the IDs of the breaker 141 and the PDU 140*a* using the modem 180*a*. The modems 180*a-b* and 152*a-b* are interfaces used in many of the embodiments described herein for transmitting data, such as the power system component IDs. It will be apparent to one of ordinary skill in the art that other types of known interfaces may be used. The modem 180*a* transmits the IDs on a trace wire 181 to the other endpoint, which in this example is the computer system 150*a*. The trace wire 181 may include a wire associated with or physically connected to the power line 191 that is operable to carry data, such as the IDs. The logical endpoints of the trace wire 181 are the same logical endpoints of the power line 191, which in this example includes an endpoint of the computer system 150*a*. The controller 170 may not know the actual component, i.e., the computer system 150*a*, connected to the other end of the trace wire 181 which needs to be mapped to the breaker 141. Thus, the ID of the breaker 141 and the ID of the PDU 140*a* are transmitted to the other endpoint of the logical link including the breaker 141 and in this example the computer system 150*a*.

The computer system 150 receives the IDs of the breaker 141 and the PDU 140*a* and transmits the IDs of the breaker 141 and the PDU 140*a* along with an ID for the computer system 150*a* to the data collections system 162. The data collection system 162 receives the IDs of all three power system components, for example, in a single message and maps the three power system components. For example, the data collection system 162 associates the ID for the breaker 141 with the ID for the computer system 150*a* as endpoints of a logical link in the power system 100. The associated IDs may be stored, for example, in a table or database. Then, a system administrator may query the stored IDs with the ID for the breaker 141 to identify the computer systems connected to the breaker 141. In other words, the system administrator needs to identify the power system components connected to the breaker 141. The system administrator simply generates a query including the ID of the breaker 141 to retrieve a list of all the power system components from the data base or mapping table that are connected to the breaker 141. The PDU 140*a* is similarly associated with the breaker 141 and the computer system 150*a* by the data collection system 162. Thus, the system administrator can identify the PDU supplying power to the computer system 150*a*.

A similar process is performed using the modem 180*b* and the trace wire 182. The controller 170 transmits the IDs for the breaker 142 and the PDU 140*a* to the endpoint, i.e., the computer system 150*b* via the trace wire 182. The computer system 150*b* receives the IDs of the breaker 142 and the PDU 140*a* and transmits the IDs of the breaker 142 and the PDU 140*a* along with an ID for the computer system 150*b* to the data collections system 162. The data collection system 162 receives the IDs of all three power system components and maps the components. The computer systems 150*a-b*, the data collection system 162, and the controller 170 may be connected via a network or another type of connection.

In the embodiment shown in FIG. 2, endpoints are automatically mapped by transmitting the ID of one endpoint, such as the ID for the breaker 141, using the controller 170. The data collection system 162 receives the IDs of both endpoints, such as the IDs for the breaker 141 and the computer system 150*a*, and automatically maps the endpoints. That is the endpoints are associated as endpoints of a logical link in the power system 100. The data collection system 162, in addition to performing the mapping, is also operable to invoke the mapping process. For example, the data collection system 162 transmits a mapping request to the controller 170. In response to receiving the mapping request, the controller 170 transmits the IDs for breakers 141 and 142 and the PDU 140*a* using the modems 180*a* and 180*b*. For example, the modem 180*a* is associated with the breaker 141 and the controller 170 transmits the IDs for the breaker 141 and the PDU 140*a* using the modem 180*a* to the endpoint consisting of the computer system 150*a*. The modem 180*b* is associated with the breaker 142 and the controller 170 transmits the IDs for the breaker 142 and the PDU 140*a* using the modem 180*b* to the endpoint consisting of the computer system 150*b*. The data collection system 162 receives the IDs for the endpoints and maps them.

Transmitting the PDU and breaker IDs is performed for all of the PDUs and breakers in the power system 100, such that the data collection system 162 is operable to automatically determine the mapping for computer systems and breakers in the power system 100. An example of a portion of a mapping table generated by the data collection system 162 is shown below.

| Mapping Table | | |
|---|---|---|
| PDU ID | Breaker ID | Computer System ID |
| 140a | 141 | 150a |
| 140a | 141 | 150b |
| 140a | 142 | 150a |
| 140a | 142 | 150d |

From this mapping table, a graphic user interface, i.e., a GUI interface, may be generated that displays the logical links between breakers and computer systems in the power system 100. A system administrator may use the GUI interface to quickly identify connected endpoints for performing maintenance and other tasks.

In the embodiment shown in FIG. 2, trace wires 181 and 182 are used to connect the modems 180*a* and 180*b* in the PDU 140*a* to the modems 152*a* and 152*b* in the computer systems. As described above, the trace wires 181 and 182 may include wires that are separate from the power lines and that connect the PDU 140*a* to the computer systems 150*a-b* in the rack 160*a*. These modems may include conventional modems operable to transmit data over a trace wire. According to another embodiment, the PDU and breaker IDs are transmitted over power lines using power line carrier modems as shown in FIG. 3.

Figure 3:
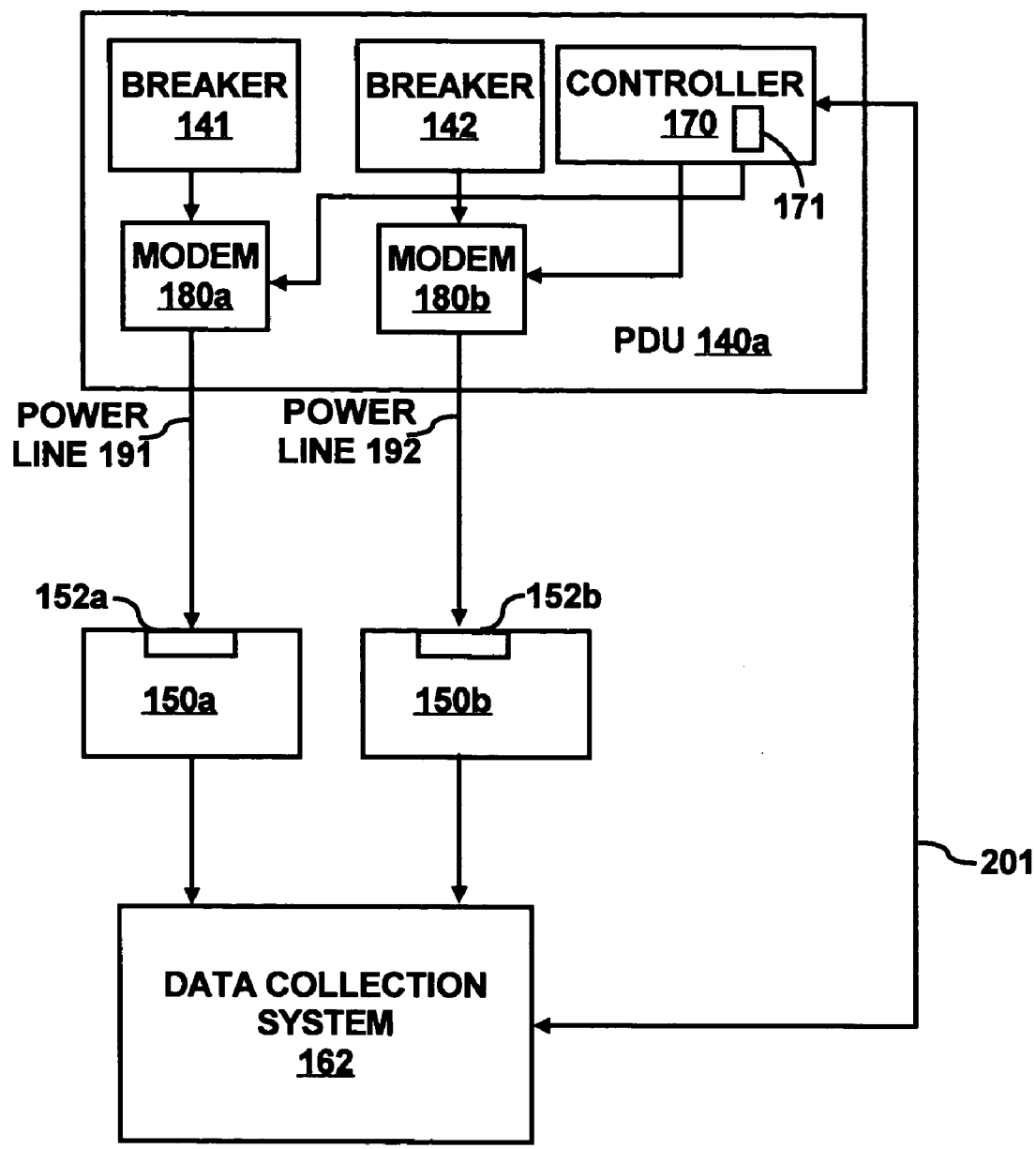
FIG. 3 illustrates a block diagram of a system for mapping endpoints in a power system using a power line, according to another embodiment.

FIG. 3 illustrates another embodiment similar to the embodiment shown in FIG. 2, except in FIG. 3 the modems 180*a-b* and 152*a-b* are power line carrier (PLC) modems transmitting information over the power lines 191-192 instead of trace wires. By using existing power lines, additional wires such as trace wires need not be added for facilitating the transmission of mapping information between the breakers 141-142 and the computer systems.

As shown in FIG. 3, the controller 170 is connected to the modems 180*a-b* for transmitting the IDS of the breakers 141 and 142 on their respective power lines 191 and 192. The ID for the PDU 140*a* may also be transmitted. The IDs are transmitted to the endpoints of the power lines 191 and 192, e.g., the computer systems 150*a*-150*b*. For example, the computer system 150a receives the IDs for the breaker 141 and the PDU 140a via the power line 191 and the PLC modem 152a and transmits the IDs, along with an ID for the computer system 150a, to the data collection system 162. The data collection system 162 associates the IDs. Similarly, the computer system 150b receives the IDs for the breaker 142 and the PDU 140a via the power line 192 and the PLC modem 152b and transmits the IDs, along with an ID for the computer system 150b, to the data collection system 162 where the IDs are associated. For example, the IDs are stored in a mapping table such as described above. The data collection system 162, in addition to performing the mapping, is also operable to invoke the mapping process by, for example, transmitting a mapping request to the controller 170.

Figure 4:
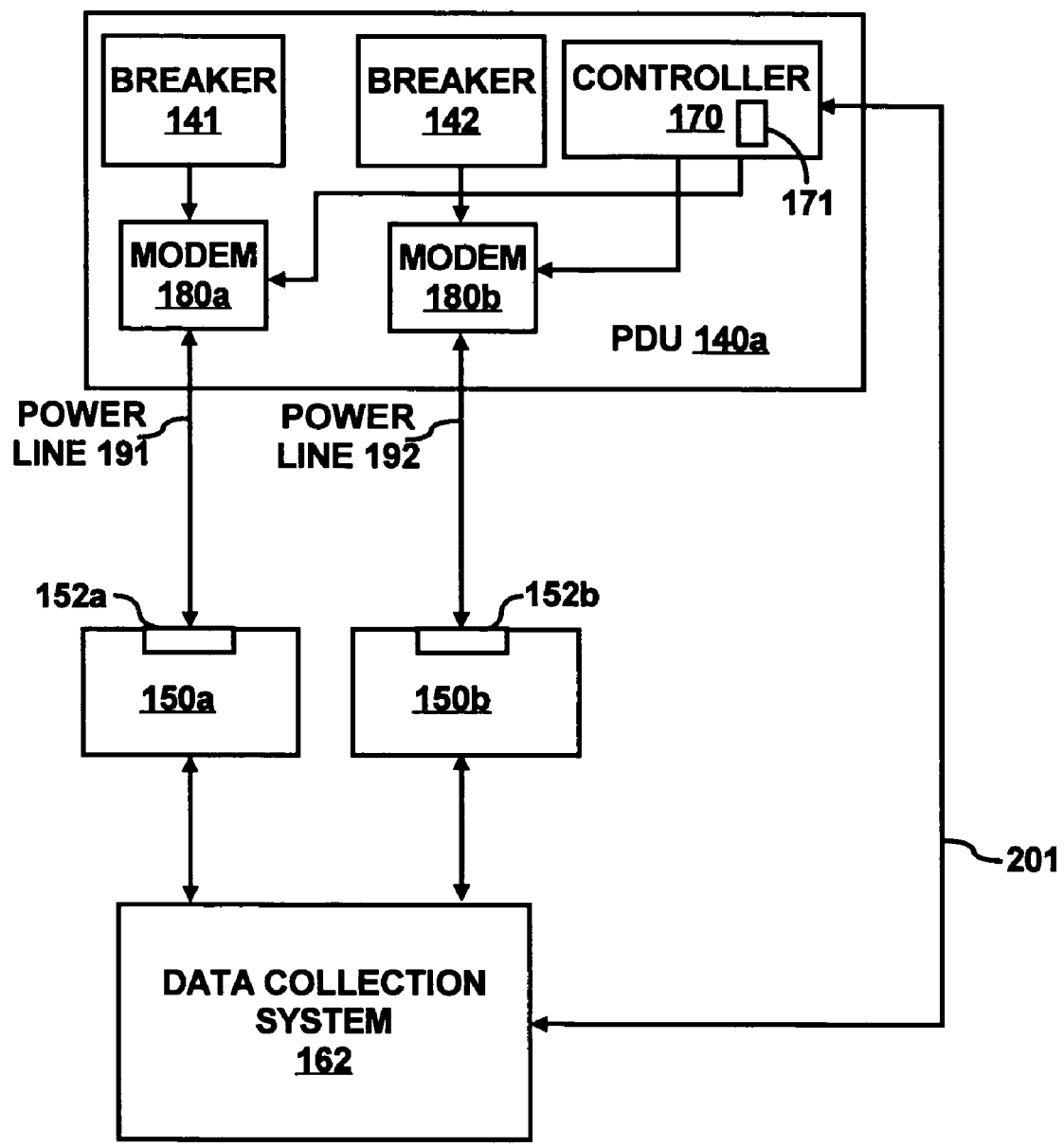
FIG. 4 illustrates a block diagram of a system for mapping endpoints in a power system using polling, according to yet another embodiment.

FIG. 4 illustrates another embodiment for determining mapping information. In the embodiments shown in FIGS. 2 and 3, mapping information is generally transmitted unidirectionally from the breakers 141-142 to the computer systems 150a-b. In the embodiment shown in FIG. 4, polling is used to retrieve mapping information from the computer systems 150a-b. For example, the controller 170 is connected to the PLC modems 180a-b. The controller 170 transmits a request for mapping information on the power lines 191-192 to the endpoints, such as the computer systems 150a-b. The computer systems 150a-b each respond to the request with a computer system ID (e.g., IP address, MAC address, etc.) using the PLC modems 152a-b respectively. In the case of multiple computer systems receiving the request at the same time, such as computer systems 150a-c in FIG. 1, the responses of the computer systems 150a-c are staggered in such a way so as to avoid multiple systems seeking to simultaneously communicate with a PLC modem, such as modem 180a. This staggering may be provided using existing collision avoidance technology, technology of which is known to those skilled in the art of communication systems. The controller 170 receives the computer system IDs and transmits the computer system IDs along with the respective breaker ID and the ID for the PDU 140a. For example, the controller 170 receives the ID for the computer system 150a. It is predetermined by the controller 170 that the other endpoint of the logical link is the breaker 141, and the breaker 141 is in the PDU 140a. Thus, the controller 170 generates a message including the IDs for the computer system 150a, the breaker 141 and the PDU 140a. The message is transmitted to the data collection system 162 for mapping. That is the IDs are associated as endpoints and possibly stored in a mapping table. The IDs for the computer system 150b, the breaker 142 and the PDU 140a are also transmitted in a message to the data collection system 162, where the IDs are mapped.

The polling may be performed for all the breakers such that a complete mapping table may be generated. Trace wires and modems operable to send signals over the trace wires may be used instead of using power lines and PLC modems to transmit mapping information.

The polling process may be invoked by the data collection system 162, for example, by transmitting a mapping request to the controller 170. Also, after identifying the endpoints, the data collection system 162 may communicate with an endpoint to determine more information about the endpoint. For example, after identifying the computer system 150a as an endpoint, the data collection system 162 may request more information from the computer system 150a, such as computer system name, computer system properties (e g., processor type, processor speed, amount of memory, etc.). This information may be stored in the mapping table and can be used by the system administrator for administrative tasks, such as load management, maintenance, etc.

FIG. 4 may be used to illustrate yet another embodiment for mapping logical endpoints. In this embodiment, the data collection system 162 communicates with each computer system, such as the computer systems 150a-b, or each rack controller, such as the rack controller shown in FIG. 5 and discussed in detail below, instructing the computer systems or rack controllers to send their IDs upstream to the connected breakers. Then, the controller 170 can associate the rack controller and/or computer system IDs with the corresponding breaker IDs. The associated IDs, which are used to map the logical endpoints, may then be transmitted to the data collection system 162. Alternatively, the controller 170 may transmit the IDs to the data collection system 162. The data collection system 162 then associates the IDs providing the mapping.

Figure 5:
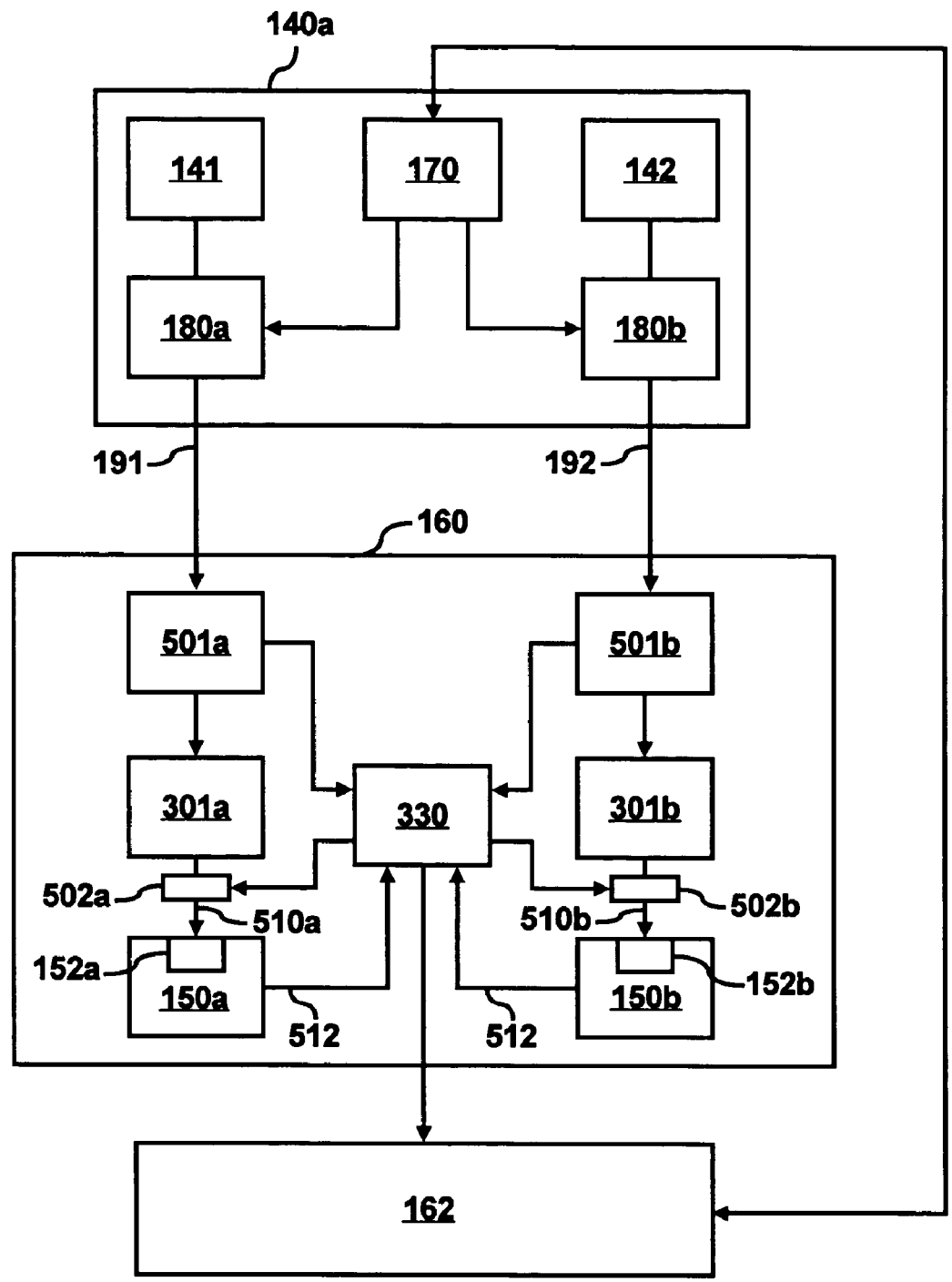
FIG. 5 illustrates a block diagram of a system for mapping endpoints in a power system including power system components in a data center rack, according to another embodiment.

FIG. 5 illustrates an embodiment of determining mapping information when a rack power supply is used to supply power received from the breakers 141-142 to the computer systems 150a-b. Racks are commonly used to house computer systems. It is not uncommon for some racks to house up to 80 computer systems. A large data center may use hundreds of racks to house computer systems. In certain instances a rack power supply is used to supply power to computer systems housed in the rack. The computer systems may also include power supplies connected to the rack power supply or may be powered by the rack power supply. Blade servers, referred to as blades, are examples of computer systems that are commonly connected to a rack power supply, but other types of computer systems may also be connected to the rack power supply.

FIG. 5 illustrates an embodiment where rack power supplies 301 a-b are used to supply power to the computer systems in the rack 160. Only computer systems 150a and 150b are shown for purposes of illustrating the embodiment. Also, although FIG. 1 illustrates that the computer system 150a receives power from the breakers 141 and 142, only one power connection to the computer system 150a from the breaker 141 is shown in FIG. 5. In addition, a rack may use one or multiple rack power supplies to supply power to components in the rack.

In the PDU 140a shown in FIG. 5, the controller 170 transmits IDs for the breakers 141 and 142 on their respective power lines 191 and 192 to the respective endpoints using the PLC modems 180a-b. Endpoints for a first logical link are the breaker 141 and the rack power supply 301a. Endpoints for a second logical link are the breaker 142 and the rack power supply 301b.

The rack 160a includes a rack controller 330. The rack controller 330 determines mapping information for the logical links between the breakers and the rack power supplies and also determines mapping information for the logical links between the rack power supplies and the computer systems. For example, the controller 170 transmits an ID for the breaker 141 and optionally for the PDU 140a on the power line 191 using the PLC modem 180a. The rack controller 330 receives the ID for the breaker 141 using the PLC modem 501a. Because the ID for the breaker 141 was received on the power line 191 via the modem 501a, the rack controller 330 determines that the endpoint for the logical link is the rack power supply 301a. The rack controller 330, for example, associates and stores the ID for the breaker 141 and the rack power supply 301a. There are additional logical links between the rack power supply 301 and the computer systems receiving power from the rack power supply 301. In FIG. 5, one of these logical links includes the rack power supply 301a and the computer system 150a. It is predetermined that the rack power supply 301 is one endpoint. In order to determine the other endpoint, the rack controller 330 transmits an ID for the power supply 301 on a power bus 510a connecting the rack power supply 301a with the other endpoint, e.g., the computer system 150a. The computer system 150a receives the ID for the rack power supply 301a using the PLC modem 152a. The computer system 150a transmits the ID for the rack power supply 301a and an ID for the computer system 150a to the rack controller 330 on a control bus 512 in the rack 160a. Other connections between the rack controller and the modems in the rack 160a may also be via the control bus 512. The rack controller 330 receives the IDs and associates and stores the IDs with the IDs for the breaker 141 and the PDU 140a. Thus, the rack controller 330 associates the IDs for the breaker 141 and the rack power supply 301a as endpoints of a first logical link. The rack controller 330a also associates the IDs for the rack power supply 301a and the computer system 150a as endpoints of a second logical link receiving power from the first logical link. This mapping information is transmitted to the data collection system 162 and stored, for example, in a mapping table.

The same process is performed to determine the endpoints of the logical links including the breaker 141 and the computer system 150b. For example, the controller 170 transmits an ID for the breaker 142 on the power line 192 using the PLC modem 180b. The rack controller 330 maps the breaker 141 with the rack power supply 301b. To determine the endpoints of the logical link between the rack power supply 301b and the power system components receiving power from the rack power supply 301b, which in this example is the compute system 150b, the rack controller 330 transmits an ID for the rack power supply 301b on a power bus 510b connecting the rack power supply 301b with the computer system 150b. The computer system 150b receives the ID for the rack power supply 301b using the PLC modem 152b. The computer system 150b transmits the ID for the rack power supply 301b and an ID for the computer system 150b to the rack controller 330 on the control bus 512. The rack controller 330 receives the IDs and associates and stores the IDs. Thus, the rack controller 330 associates the IDs for the breaker 142 and the rack power supply 301b as endpoints of a first logical link. The rack controller 330 also associates the IDs for the rack power supply 301b and the computer system 150b as endpoints of a second logical link receiving power from the first logical link. This mapping information is transmitted to the data collection system 162 and stored, for example, in a mapping table.

In another embodiment, similar to the embodiment shown in FIG. 4, the controller 170, which is connected to the breakers, polls the racks for their rack IDs. For example, the controller 170 polls the rack 160a for its ID. The controller 170 then transmits the IDs for the PDU 140a, the breaker 141, and the rack 160a to the data collection system 162. In this embodiment, although not shown in FIG. 5, the data collection system 162 is connected to the controller 170, such as shown in FIG. 4. The data collection system 162 may generate an entry in a mapping table for those connected endpoints. Alternatively, the data collection 160a may already store the IDs for the breaker 141 and the PDU 140a, and the controller 170 transmits the ID for the rack 160a to the data collection system 162. The data collection system 162 associated the rack 160a with the PDU 140a and the breaker 141 and creates an entry for those endpoints in the mapping table.

Also in this polling embodiment, the controller 170 may receive mapping information from the rack controller 330 for the logical links between the rack power supplies and the computer systems. This mapping information is determined, such as described above with respect to FIG. 5 and transmitted to the controller 170 when a request is transmitted from the controller 170. The controller 170 may then transmit the mapping information to the data collection system 162. An example of the mapping table is shown below.

Mapping Table

| PDU ID | Breaker ID | Rack ID | Rack Power Supply ID | Computer System ID |
|--------|-----------|---------|---------------------|--------------------|
| 140a   | 141       | 160a    | 301a                | 150a               |
| 140a   | 142       | 160a    | 301b                | 150b               |

In yet another embodiment associated with FIG. 5, IDs are sent upstream from the rack 160 to the breakers 141 and 142. For example, the data collection system 162 communicates with the rack controller 330 instructing the rack controller 330 to send an ID for the rack power supply 301a via the power line 191. The controller 170 receives the ID for the rack power supply 301a and associates the ID with the ID of the breaker 141. Alternatively, the IDs for the rack power supply 301a and the breaker 141 are transmitted from the controller 170 to the data collection system 162, where the IDs for the rack power supply 301a and the breaker 141 are associated. In addition to transmitting the ID for the rack power supply 301a, the rack controller 330 may also transmit the mapping information for the computer systems connected to the rack power supply 301a in the rack 160. Thus, the data collection system 162 may store the mapping information for two connected logical links, such as the logical link between the breaker 141 and the rack power supply 301a and the logical link between the rack power supply 301a and the computer system 150a.

Figure 6:
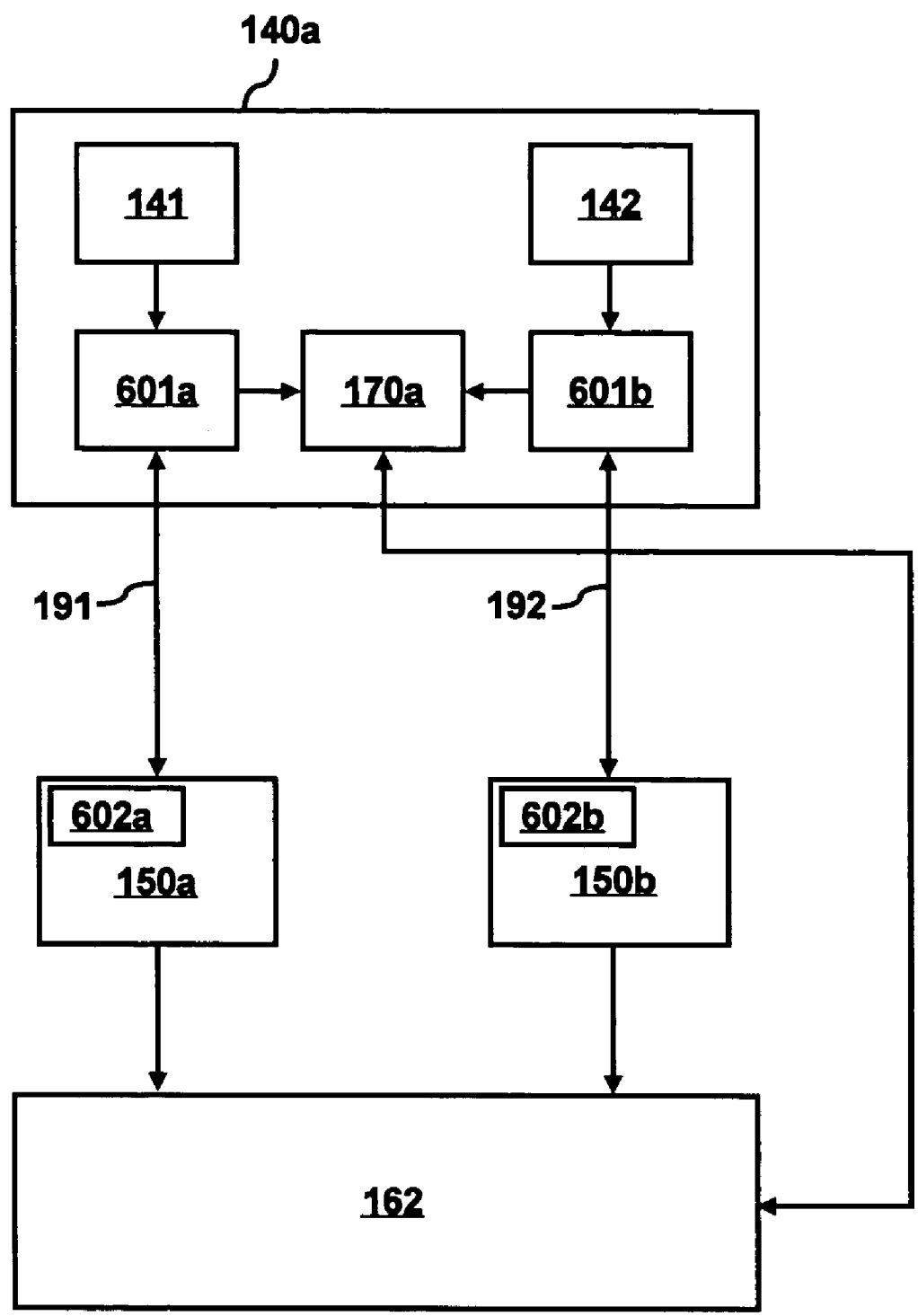
FIG. 6 illustrates a block diagram of a system for mapping endpoints in a power system based on measured parameters at the first and second power system components, according to another embodiment.

FIG. 6 illustrates an embodiment for mapping endpoints in the power system 100 using statistical analysis. In previous embodiments mapping information, such as power system component IDs, is transmitted between endpoints and eventually to the data collection system 162 to map the endpoints, which may include generating a mapping table. In the embodiment shown in FIG. 6, well known statistical methods are applied for detecting a correlation between the current drawn by each computer system and the current drawn by each of the components to map endpoints.

FIG. 6 shows a current sensor 601a at the breaker 141 and a current sensor 601b at the breaker 142. The current sensors 601a-b may include sensors at the PDU 140a operable to measure branch currents passing through the breakers 141-142. An example of the sensors is a branch current monitor provided by Schneider Electric. The current sensors 601a-b are connected to the controller 170, and the controller 170 periodically receives measurements from the currents sensors 601a-b. These measurements are transmitted to the data collection system 162.

FIG. 6 also shows current sensors 602a-b measuring the current drawn by the computer systems 150a-b respectively. The current sensors 602a-b may include conventional current meters or other known power measuring devices for determining the current drawn by a computer system. The current sensors 602a-b may be connected to a power supply, not shown, for the computer system 150a.

The data collection system 162 maps the computer systems 150a-b to their respective breakers 141-142 based on the power consumption (in the case measured current draw) at each component. For example, if the computer system 150a is turned on at a time t1, there is a significant increase in its power consumption at that time. The data collection system 162 finds a breaker (e.g., the breaker 141) that has a branch current with a similar increase. Then, the data collection system 162 maps the computer system 150a to the breaker 141. Mapping decisions made by the data collection system 162 may be based on a large number of power consumption measurements to minimize mapping errors. Similarly mapping is performed based on the current measurements for the breaker 142 and the computer system 150b.

In another embodiment, an intentional power variation, i.e., a power signature is created at a computer system such that the variation in current consumption can be readily detected at the connected breaker. For example, the power consumption at the computer system 150a is varied between two levels for a period of time, thereby creating a square wave with variable frequency. Such a variation may be achieved by running an application that drives the processor utilization of the computer system 150a 100% then to 0% then to 100%, etc. The square wave is detected at the breaker 141 by the data collection system 162 based on the measurements taken by the current sensor 601a, and the data collection system 162 maps the computer system 150a to the breaker 141.

Figure 7:
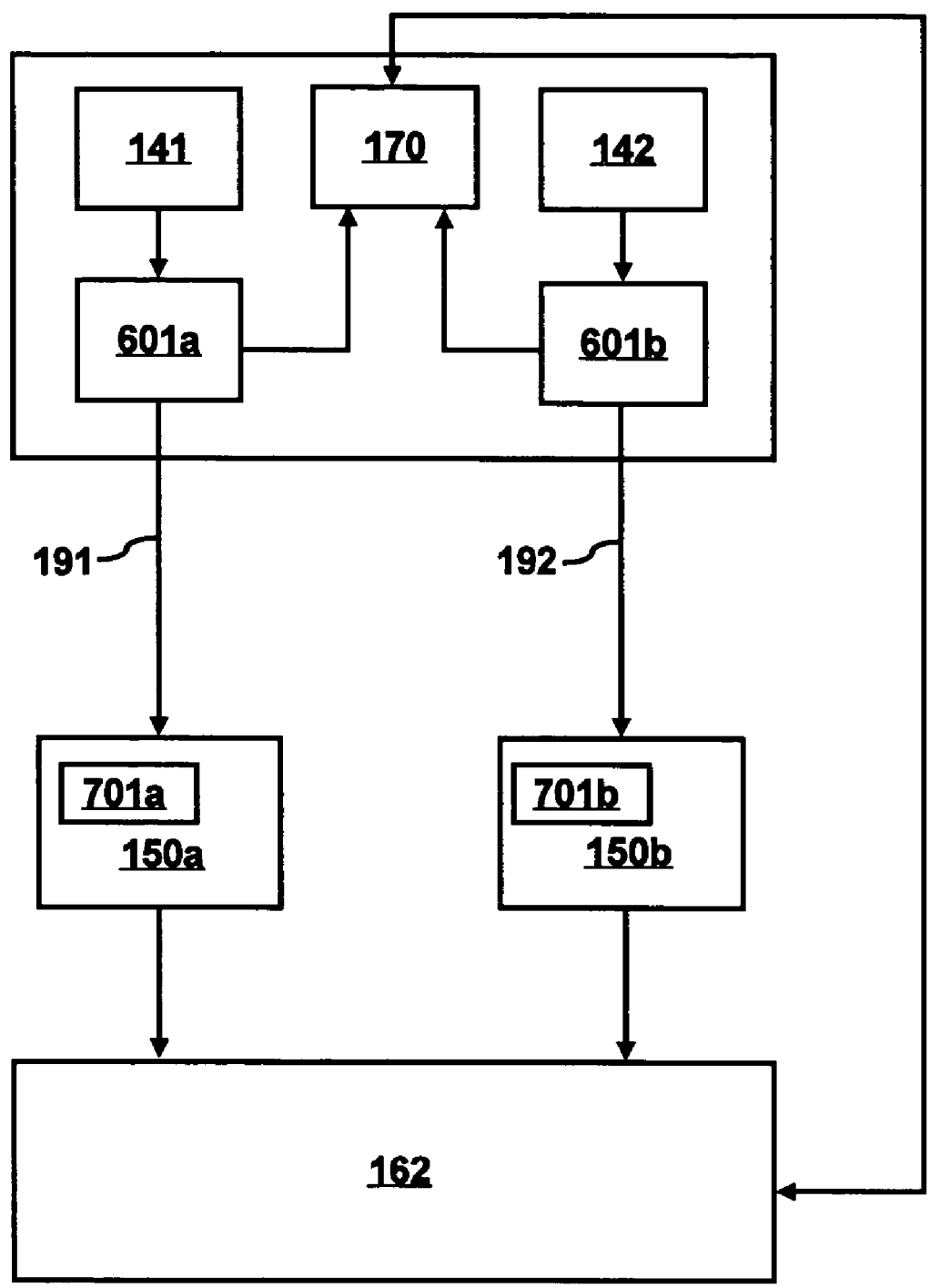
FIG. 7 illustrates a block diagram of a system for mapping endpoints in a power system based on measured parameters at the first and second power system components wherein the parameters are different, according to another embodiment.

FIG. 7 illustrates another embodiment similar to the embodiment shown in FIG. 6. However, in FIG. 7 resource monitors 701a-b are used to measure utilization of system resources in the computer systems 150a-b respectively. Examples of measured system resource utilizations may include CPU cycles, memory utilization, I/O traffic generated, etc. For example, the data collection system 162 receives CPU cycles from the resource monitor 701a. An increase or decrease in CPU cycles measured at the computer system 150a is correlated with an increase or decrease in current at the breakers 141-142 to map the computer system 150a to a breaker. For example, an increase in CPU cycles at a time t1 corresponds to a similar increase in current measured by the current sensor 601a. Thus, the data collection system 162 maps the computer system 150a to the breaker 141. A similar mapping may be performed for the computer system 150b and the breaker 142. Also, an intentional workload variation may be created at a computer system such that the variation in workload results in a current variation at a connected breaker. For example, the CPU cycles at the computer system 150a is varied between two levels for a period of time, thereby creating a square wave with variable frequency. Such a variation may be achieved by running an application that drives the processor utilization of the computer system 150a 100% then to 0% then to 100%, etc. The square wave is detected at the breaker 141 by the data collection system 162 based on the measurements taken by the current sensor 601a, and the data collection system 162 maps the computer system 150a to the breaker 141.

In addition to mapping endpoints of logical links in the power system 100, the data collection system 162 is also operable to map loads to each logical link. The load, e.g., the current, at the endpoints is measured and transmitted to the data collection system 162. The data collection system 162 includes the load with the associated entry in the mapping table. For example, referring to FIG. 6, the current sensor 601a measures current at the breaker 141, and the sensor 602a measures current at the computer system 150a. The current measurements are transmitted to the data collection system 162. The data collection system 162 adds the measurements with an entry in the mapping table including the breaker 141 and the computer system 150a. FIGS. 4 and 5 illustrate embodiments using a PDU or rack power supply. In these embodiments, current or power consumed for the entire rack may be measured or branch currents associated with power consumption by each computer system 150a-b connected to the rack power supplies 301a-b may be measured and transmitted to the data collection system 162.

Based on the received measurements, the data collection system 162 can prepare summaries showing such quantities as: (1) the total amount of current currently being drawn from a circuit by all connected systems, or the maximum current that might be drawn by all the computer systems if all the computer systems draw their respective maximum amount at the same time; (2) the aggregate load (measured in volt-amperes) that must be supported by the UPS in the case of a power interruption; and (3) the data collection system 162 may determine the maximum load that could be placed on a circuit or UPS by querying a separately maintained database containing the specifications of each system. The rating information may be supplied by the systems.

Figure 8:
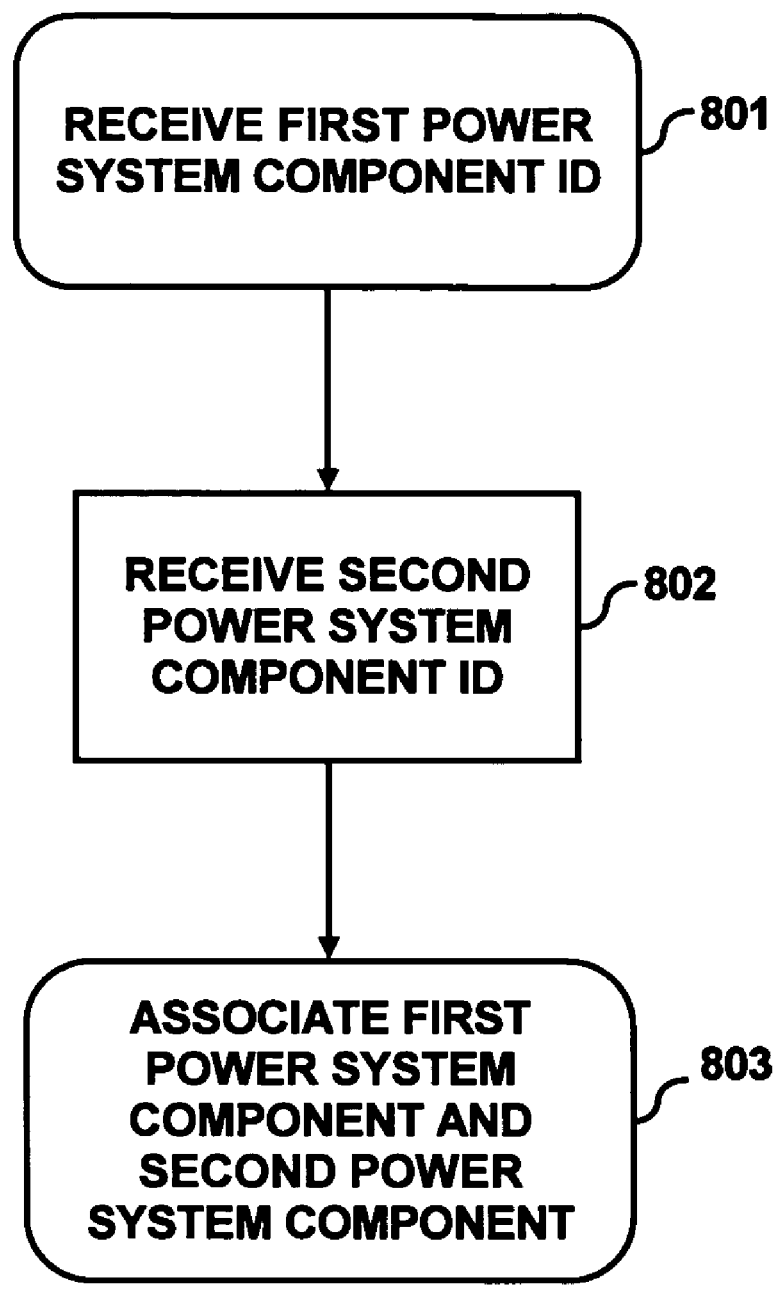
FIG. 8 illustrates a flow chart of a method for mapping endpoints in a power system, according to an embodiment.

FIG. 8 illustrates a method 800 for mapping components in a power system, according to an embodiment. The method 800 is described with respect to the power system shown in FIGS. 1-5 by way of example and not limitation. Furthermore, the steps of the method 800 may be performed by software, hardware or a combination thereof.

At step 801, the data collection system 162 receives an ID for a first power system component. At step 802, the data collection system 162 receives an ID for a second power system component. The IDs may be received, for example, from the second power system component or from the controller 170. Examples of the second power system component may include the computer systems 150, or any other power system component in the power system 100 operable to receive power from another power system component.

At step 803, the data collection system 162 associates the first and second power system components. In one example, the data collection system 162 associates the first and second power system components as endpoints of a logical link in the power system 100, i.e., the data collection system 162 maps the first and second power system components. The association may be stored in a mapping table or database along with other associated power system components. A system administrator may utilize the mapping table to quickly identify logical links and their endpoints in the power system.

Figure 9:
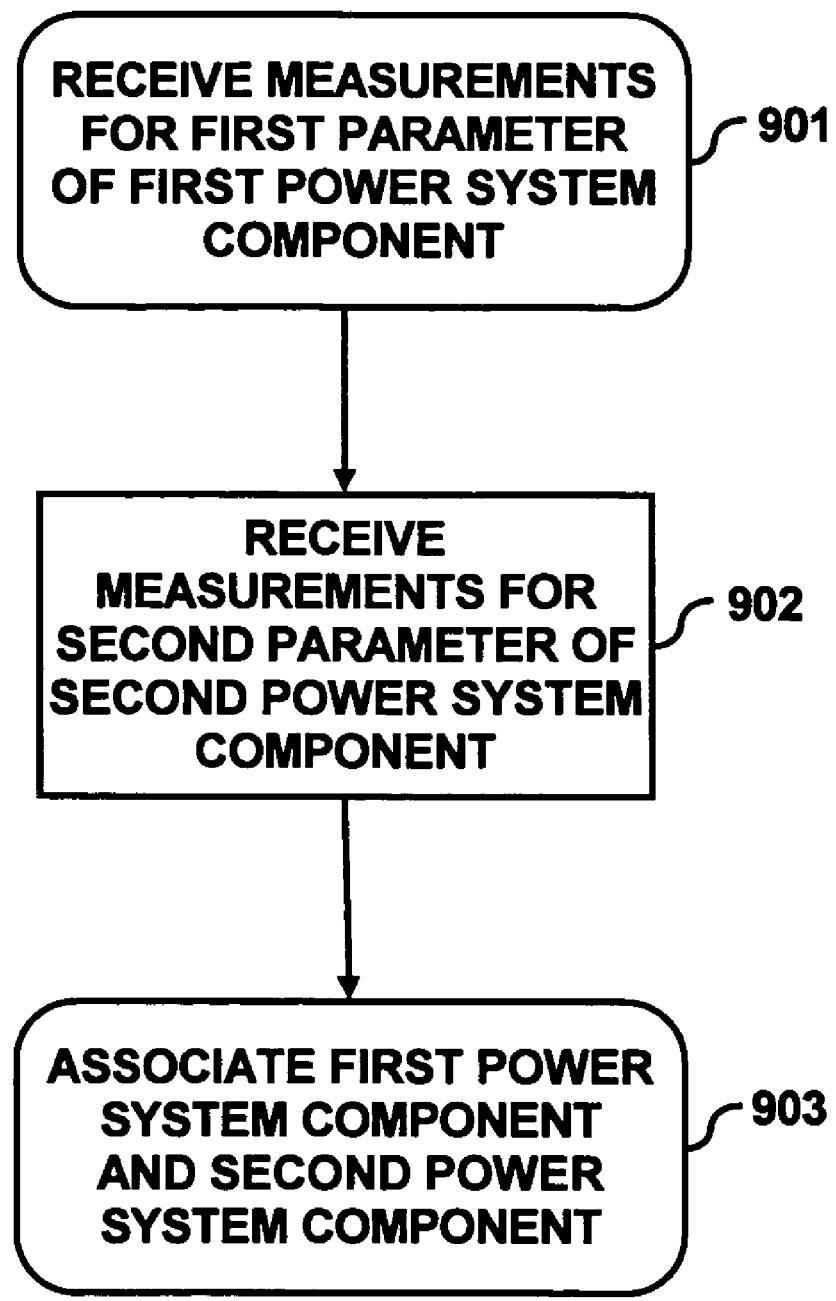
FIG. 9 illustrates another flow chart of a method for mapping endpoints in a power system, according to an embodiment.

FIG. 9 illustrates a method 900 of mapping power system components, according to another embodiment. The method 900 is described with respect to the embodiments shown in FIGS. 6 and 7 by way of example and not limitation. Furthermore, the steps of the method 900 may be performed by software, hardware or a combination thereof.

At step 901, the data collection system 162 receives measurements associated with a first parameter of a first power system component. At step 902, the data collection system 162 receives measurements associated with a second parameter for a second power system component. The first power system component supplies power to the second power system component. The first and second parameters in one example are associated with power, such as the current measured at the respective components. The current sensors 601a-b and 602a-b shown in FIG. 6 may be used to measure the current at each of the power system components. In another example, the second parameter is associated with the utilization of system resources at the second power system component, such as processor utilization, memory utilization, I/O traffic, etc. The resource monitors 701a-b shown in FIG. 7 may be used to measure resource utilization in the second power system component.

At step 903, the data collection system 162 associates the first power system component with the second power system component based on similarities of the measurements for the first and second parameters. For example an increase in current measured at a time t1 for the first power system component is similar to an increase in current or an increase in resource utilization at the time t1 for the second power system component, the data collection system 162 associates the two power system components as endpoints of a logical link in the power system.

What has been described and illustrated herein are embodiments of the invention. The terms, descriptions and figures used herein are set forth by way of illustration only and are not meant as limitations. Those skilled in the art will recognize that many variations are possible within the spirit and scope of the invention.

What is claimed is:

1. An apparatus for mapping components in a power system, the apparatus comprising:
   a controller operating to transmit a first power system component ID for a first power system component to a second power system component, wherein the second power system component receives power from the first power system component; and
   a data collection system operating to receive from the second power system component the first power system component ID and a second power system component ID for the second power system component, wherein the data collection system further operates to associate the first power system component with the second power system component based on the received first power system component ID and the second power system component ID.

2. The apparatus of claim 1 further comprising a first interface, wherein the controller operates to transmit the first power system component ID to the second power system component via the first interface.

3. The apparatus of claim 2, further comprising a second interface connected to the second power system component, wherein the second power system component operates to receive the first power system component ID via the second interface.

4. The apparatus of claim 3, wherein the first and second interfaces are comprised of modems connected via a trace wire.

5. The apparatus of claim 3, wherein the first and second interfaces are comprised of power line carrier modems connected via a power line supplying power from the first power system component to the second power system component.

6. The apparatus of claim 1, wherein the data collection system transmits a request to the controller requesting the controller to transmit at least one power system component ID.

7. The apparatus of claim 1, wherein the controller operates to transmit a first plurality of power system component IDs associated with a first plurality of power system components to a second plurality of power system components each receiving power from at least one or the first power system components.

8. The apparatus of claim 7, wherein the second plurality of power system components operate to transmit the plurality of first power system component IDs and a plurality of second power system component IDs for the plurality of second power system components to the data collection system.

9. The apparatus of claim 8, wherein the data collection system operates to associate each of the plurality of first power system component IDs with a respective one of the plurality of second power system component IDs.

10. The apparatus of claim 1, wherein the first power system component comprises a breaker.

11. The apparatus of claim 10, wherein the second power system component comprises a computer system connected to the breaker.

12. The apparatus of claim 1, further comprising:
    a first sensor used to determine the power supplied from the first power system component to the second power system component; and
    a second sensor used to determine the power consumed by the second power system component, wherein the data collection system is operating to receive measurements from the first and second sensors and associate the measurements with the first power system component and the second power system component respectively.

13. The apparatus of claim 1, wherein the data collection system operates to associate the first power system component with the second power system component as endpoints of a logical link in the power system.

14. An apparatus comprising:
    a first controller operating to transmit a circuit breaker ID for a circuit breaker to a second controller for a rack, wherein the second controller is operating to transmit a message to at least one computer system housed in the rack requesting an ID for the at least one computer system; and
    a data collection system operable to receive the circuit breaker ID and the ID for the at least one computer system, wherein the data collection system is further operable to associate the circuit breaker and the at least one computer system based on the received circuit breaker ID and the ID for the at least one computer system.

15. The apparatus of claim 14, wherein the first controller is operating to transmit the circuit breaker ID via a power line between the circuit breaker and a rack power supply supplying power to the at least one computer system.

16. The apparatus of claim 15, wherein the second controller is further operating to transmit the message to the at least one computer system via a power line between the rack power supply and the at least one computer system.

17. The apparatus of claim 16, wherein the second controller is operating to transmit at least one of the ID of the at least one computer system, the circuit breaker ID, a rack power supply ID For the rack power supply, and an ID for a power distribution unit associated with the circuit breaker to the data collection system.

18. The apparatus of claim 17, wherein the data collection system is further operating to associate the circuit breaker with the rack power supply and is further operating to associate the at least one computer system with the rack power supply based on at least some of the IDs transmitted to the data collection system.

19. The apparatus of claim 17, wherein the data collection system is further operating to associate the circuit breaker with the rack power supply as endpoints of a first logical link in the power system and is further operating to associate the at least one computer system with the rack power supply as endpoints of a second logical link in the power system.

20. The apparatus of claim 14, wherein the data collection system is operating to transmit a request to the controller requesting the controller to transmit the circuit breaker ID.

21. The apparatus of claim 14, further comprising:
a first sensor used to determine the power supplied from the circuit breaker to the rack power supply; and
a second sensor used to determine the power consumed by a rack power supply receiving power from the circuit breaker and supplying power to the at least one computer system, wherein the data collection system is operating to receive measurements from the first and second sensors and associate the measurements with the circuit breaker and the rack power supply.

22. The apparatus of claim 21, further comprising a sensor at the at least one computer system used to measure power consumed by the at least one computer system, wherein the data collection system is operable to receive measurements from the sensor at the at least one computer system and associate the measurements with the at least one computer system.

23. The apparatus of claim 14, wherein the data collection system is further operating to associate the circuit breaker and the at least one computer system as endpoints of at least one logical link in the power system.

24. An apparatus comprising:
a controller operating to transmit a request for an ID to a second power system component and receive a second power system component ID for the second power system component in response to the request, wherein the second power system component receives power from a first power system component; and
a data collection system operating to receive a first power system component ID for the first power system component and the second power system component ID from the controller, wherein the data collection system operates to associate the first power system component and the second power system component based on the received first power system component ID and the second power system component ID.

25. The apparatus of claim 24, further comprising a first interface, wherein the controller is operating to transmit the first power system component ID to the second power system component via the first interface.

26. The apparatus of claim 25, further comprising a second interface connected to the second power system component, wherein the second power system component is operating to receive the request via the second interface.

27. The apparatus claim 26, wherein the first and second interfaces are comprised of modems connected via a trace wire.

28. The apparatus of claim 26, wherein the first and second interfaces are comprised of power line carrier modems connected via a power line transmitting power from the first power system component to the second power system component.

29. The apparatus of claim 24, wherein the data collection system transmits a mapping request to the controller requesting the controller to transmit the request to the second power system component.

30. The apparatus of claim 24, wherein the controller is operating to transmit the request to each of a plurality of power system components, wherein each of a plurality of power system components receives power from at least one of a first plurality of power system components.

31. The apparatus of claim 30, wherein the controller is operating to receive IDs for each of the plurality of second power system components and is further operating to transmit IDs for the plurality of first power system components and the plurality of second power system components to the data collection system.

32. The apparatus of claim 31, wherein the data collection system is operating to associate each of the plurality of first power system components to one of the plurality of second power system components receiving power from a respective first power system component.

33. The apparatus of claim 24, wherein the first power system component comprises a breaker.

34. The apparatus of claim 33, wherein the second power system component comprises a computer system connected to the breaker.

35. The apparatus of claim 24, wherein the data collection system is further operating to associate the first power system component and the second power system as endpoints for at least one logical link in the power system.

36. The apparatus of claim 24, further comprising:
a first sensor used to determine the power supplied from the first power system component to the second power system component; and
a second sensor used to determine the power consumed by the second power system component, wherein the data collection system is operating to receive measurements from the first and second sensors and associate the measurements with the first power system component and the second power system component respectively.

37. An apparatus comprising:
a first controller operating to receive measurements from a first sensor measuring a first parameter for a first power system component in a power system; and
a data collection system operating to receive the measurements from the first controller and is further operating to receive measurements from a second sensor measuring a second parameter for a second power system component in the power system receiving power from the first power system component, wherein the data collection system is operating to associate the first power system component with the second power system component based on the received measurements from the first and second sensors.

38. The apparatus of claim 37, wherein the data collection system is operating to receive measurements from a plurality of sensors associated with a plurality of power system components in the power system, and the data collection system is further operating to associate the first power system component and the second power system component based on similarities between the received measurements from the first and second sensors.

39. The apparatus of claim 37, wherein the first parameter and the second parameter are associated with the power supplied to the second power system component from the first power system component and the power consumed by the second power system component.

40. The apparatus of claim 37, wherein the first power system component comprises a circuit breaker.

41. The apparatus of claim 37, wherein the second power system component comprises a computer system.

42. The apparatus of claim 41, wherein the second parameter is associated with utilization of at least one resource of the computer system.

43. The apparatus of claim 42, wherein the second parameter comprises at least one of processor utilization, memory utilization, and I/O traffic.

44. The apparatus of claim 37, wherein the first controller is operating to transmit the measurements from the first sensor to the second power system component, and the second power system component is operating to transmit the measurements from the first and second sensors to the data collection system.

45. The apparatus of claim 37, wherein the first controller is operating to transmit a request for the measurements from the second sensor to the second power system component, and the second power system component is operating to transmit the measurements from the first and second sensors to the data collection system.

46. The apparatus of claim 37, wherein the data collection system is operating to transmit a request to the first controller for at least one of the measurements from the first and second sensor.

47. The apparatus of claim 37, wherein the data collection system is further operating to associate the first power system component with the second power system component as endpoints for a logical link in the power system.

48. A method comprising:
receiving an ID for a first power system component at a data collection system, the ID being transmitted from at least one of a controller and a second power system component, wherein the second power system component receives power from the first power system component;
receiving an ID for a second power system component at the data collection system, the ID for the second power system component being transmitted from at least one of the first controller and the second power system component; and associating the first power system component and second power system component as endpoints of a logical link in the power system based on the received IDs of the first and second power system components.

49. The method of claim 48, further comprising:
transmitting a request from the data collection system for the IDs of the first and second power system components.

50. The method of claim 48, further comprising:
transmitting the ID for the first power system component from the controller to the second power system component; and
transmitting the IDs for the first and second power system components to the data collection system from the second power system component.

51. The method of claim 48, further comprising:
transmitting a request from the first controller to the second power system component;
receiving the ID for the second power system component in response to the request at the controller; and
transmitting the IDs for the first and second power system components from the controller to the data collection system.

52. The method of claim 48, further comprising:
transmitting the ID for the first power system component from the controller to the second power system component; and
receiving the ID for the first power system component at a rack controller for a rack including a rack power supply and at least one computer system receiving power from the rack power supply; and
transmitting the IDs for the first power system component and an ID for the rack power supply to the data collection system, wherein the rack power supply is the second power system component.

53. The method of claim 52, further comprising:
transmitting the ID for the rack power supply from the rack controller to the at least one computer system; and
receiving the IDs for the at least one computer system at the rack controller.

54. The method of claim 53, further comprising:
receiving the ID for the at least one computer system at the data collection system; and
associating the rack power supply and the at least one computer systems as endpoints of a second logical link in the power system.

55. An apparatus comprising:
means for receiving an ID for a first power system component, the ID being transmitted from at least one of a controller and a second power system component, wherein the second power system component receives power from the first power system component;
means for receiving an ID for a second power system component, the ID for the second power system component being transmitted from at least one of the first controller and the second power system component; and
means for associating the first power system component and second power system component as endpoints of a link in the power system based on the received IDs for the first and second power system components.

56. The apparatus of claim 55, further comprising:
means for transmitting a request from the data collection system for the IDs of the first and second power system components.

57. The apparatus of claim 55, further comprising:
means for transmitting the ID for the first power system component from the controller to the second power system component; and
means for transmitting the IDs for the first and second power system components to the data collection system from the second power system component.

58. The apparatus of claim 55, further comprising:
means for receiving an ID of a third power system component receiving power from the second power system component; and
means for associating the second power system component and the third power system components as endpoints of a second logical link in the power system based on the received IDs for the second and third power system components.

59. A method comprising:
receiving measurements of a first parameter for a first power system component at a data collection system;
receiving measurements of a second parameter for a second power system component at the data collection system; and
associating the first and second power system components as endpoints of a logical link in a power system based on similarities between the measurements of the first parameter and the measurements of the second parameter.

60. The method of claim 59, further comprising:
varying the power consumption of the second power system component in a predetermined pattern; and
detecting a similar variance in power at the first power system component; and
associating the first and second power system components based on the detected similar variance in power.

61. An apparatus for mapping components in a power system, the apparatus comprising:

a data collection system operating to instruct a device to transmit mapping information upstream from a first endpoint of a logical link in the power system to a second endpoint of the logical link;

a controller operating to receive the mapping information for the first endpoint and determine mapping information for the second endpoint and transmit the mapping information for the first and second endpoints to the data collection system.

62. The apparatus of claim 61, wherein at least one of the data collection system and the controller is operating to associate the first endpoint and the second endpoint as endpoints or the logical link based on the mapping information received from the device and the mapping information determined by the controller.

63. The apparatus of claim 61, wherein the device comprises one of a computer system and a rack controller.

64. The apparatus of claim 63, wherein the first endpoint comprises one of a computer system and a rack power supply and the second endpoint comprises a circuit breaker.

65. The apparatus of claim 61 wherein the mapping information for the first and second endpoints comprises IDs for the first and second endpoints.

* * * * *

UNITED STATES PATENT AND TRADEMARK OFFICE
CERTIFICATE OF CORRECTION

PATENT NO. : 7,269,753 B2
APPLICATION NO. : 10/927235
DATED : September 11, 2007
INVENTOR(S) : Keith Istvan Farkas et al.

It is certified that error appears in the above-identified patent and that said Letters Patent is hereby corrected as shown below:

In column 13, line 41, in Claim 2, after "claim 1" insert -- , --.

In column 13, line 66, in Claim 7, after "one" delete "or" and insert -- of --, therefor.

In column 14, line 55, in Claim 17, after "supply ID" delete "For" and insert -- for --, therefor.

In column 15, line 19, in Claim 22, delete "operable" and insert -- operating --, therefor.

In column 15, line 51, in Claim 27, after "apparatus" insert -- of --.

In column 19, line 13, in Claim 62, after "endpoints" delete "or" and insert -- of --, therefor.

Signed and Sealed this

Twenty-third Day of June, 2009

JOHN DOLL
*Acting Director of the United States Patent and Trademark Office*